United States Patent [19]

Toda

[11] Patent Number: 5,579,275
[45] Date of Patent: Nov. 26, 1996

[54] VIDEO MEMORY SYSTEM

[75] Inventor: Haruki Toda, Yokohama, Japan

[73] Assignee: Kabushiki Kaisha Toshiba, Tokyo, Japan

[21] Appl. No.: 353,675

[22] Filed: Dec. 12, 1994

[30] Foreign Application Priority Data

Dec. 10, 1993 [JP] Japan .................................. 5-341373

[51] Int. Cl.⁶ ..................................................... G11C 8/00
[52] U.S. Cl. ................ 365/230.09; 365/219; 365/230.05
[58] Field of Search .............................. 365/219, 230.05, 365/230.09, 240, 189.12

[56] References Cited

U.S. PATENT DOCUMENTS

| | | | |
|---|---|---|---|
| 5,065,369 | 11/1991 | Toda | 365/230.05 |
| 5,185,724 | 2/1993 | Toda | 365/234 |
| 5,247,484 | 9/1993 | Watanabe | 365/230.05 |
| 5,257,237 | 10/1993 | Aranda | 365/230.05 |
| 5,319,603 | 6/1994 | Watanabe | 365/230.05 |

*Primary Examiner*—A. Zarabian
*Attorney, Agent, or Firm*—Loeb & Loeb LLP

[57] ABSTRACT

A video memory system includes a RAM for storing fixed image data at partial portions, two SAMs each split into at least first and second portions each for transferring a series of data simultaneously to the RAM, without synchronism with each other, a transferring section for transferring data from/to the second portion of the SAM to/from the RAM, when the first portion of the SAM is being accessed in series, and address designating section for determining a head address for serial access in the first portion of the SAM and a final address at which the serial access in the first portion is shifted to serial access in the second portion of the SAM. When two different image data are displayed simultaneously on a display, as when an inserted picture is required to be displayed on a background, it is possible to arrange the image data at predetermined area of the memory, irrespective of the position of the inserted picture on the display.

32 Claims, 17 Drawing Sheets

5,579,275

VIDEO MEMORY SYSTEM

BACKGROUND OF THE INVENTION

1. Field of the Invention

The present invention relates to a triple-port video memory system provided with both a single random access memory (referred to as RAM, hereinafter) and two serial access memories (referred to as SAMs, hereinafter), and more specifically to a video memory system suitable for use with a system for displaying a plurality of pictures in windows in particular when serial image data obtained by a camera are displayed on a display unit.

2. Description of the Background Art

Multimedia have come public notice as auxiliary means for intellectual activity. In the multimedia, the technique related to image data composed of a great quantity of information is particularly important. That is, the important technique is to transmit information effectively by processing and displaying motion picture or by displaying both motion picture and motionless picture on the same display screen. In the field of the processing and displaying the motion picture, the video memory is extremely important from the standpoint of the data processing.

In general, image data are outputted from a camera in series and further inputted to a display unit also in series with respect to time. Therefore, as far as the image data obtained by a camera are simply displayed, no specific functions are required for the video memory. That is, the ordinary video memory can be used as it is, which can store inputted data and output the stored data simply.

However, when image data are required to be processed, a special video memory is necessary which can access the stored image data at random and further can rewrite the image data freely. Since data are outputted from the camera continuously, the triple-port video memory (triple-port VRAM) provided with both an input serial port and an output serial port (to the display unit) is suitable for processing the motion picture.

FIG. 11 is an illustration for assistance in explaining the concept of the triple-port video RAM (VRAM) so far proposed. In FIG. 11, two SAMs (SAMA and SAMB) are arranged for one RAM, and each of these SAMA, RAM and SAMB can be operated perfectly independently. However, a split transfer method is adopted to data transfer between the SAMA and RAM and data transfer between the RAM and the SAMB, respectively. Further, during the data transfer, the access to the RAM is limited. As is well known, in this split transfer method, the memory is split into some split sections, and data are transferred for each split memory section. To realize the split data transfer as described above, each memory section is split into a lower portion L and an upper portion U.

The image data transfer operation of the triple-port video RAM (VRAM) shown in FIG. 11 will be described hereinbelow.

Image data outputted from a camera 20 are inputted in sequence and in series from the lower portion L to the upper portion U of the SAMA. When the data are being inputted to the upper portion U of the SAMA, data in the lower portion L of the SAMA are transferred to one row 1 of the RAM, for instance. Further, in the same way, the data are written to rows 2 and 3 of the RAM in sequence. The data stored in the RAM are accessed at random and processed (e.g., a part of data are rewritten) before transferred to the SAMB. After that, data stored in the row 1 of the RAM are transferred to the lower portion L of the SAMB. When the data are being outputted to a display 30 in series, data in the SAMBL portion are transferred to the SAMBU portion, and the data in the RAM are transferred to the upper portion U of the SAMB, so that the data in the rows 2 and 3 of the RAM are transmitted in sequence to the display 30.

In the case of the motion picture, since the image data are not interrupted, the time during which data can be processed is the time interval during which data are stored in the RAM. Accordingly, the data processing time is proportional to the memory capacity of the RAM. As described above, the data values in the RAM always change due to the data transfer to the SAMB and the data rewrite in the RAM itself.

FIG. 12 is an illustration for assistance in explaining the operation the case where an inserted picture (whose data are different from the data of the background picture) is displayed on a part (i.e., a window 31) on the display picture 30. In FIG. 12, only two SAMs and a RAM are shown. Further, in practice, pixel data arranged along a single horizontal scanning line S (crossing the window 31 in FIG. 13) are stored in a plurality of VRAMs separately and therefore the pixel data are processed as discrete data from the respective SAMs. In this example, however, the explanation will be made by assuming that data are given from the SAM of one VRAM for brevity.

In this case, as shown in FIG. 12, if the row 3 of the RAM corresponds to the scanning line S, the data values in the row 3 of the RAM are rewritten before being transferred to the SAMB to obtain any required display. However, when the data existing between two addresses (a) and (b) in correspondence to the window width ends A and B are fixed data such as letter data, since the data must be always rewritten, such data processing is not effective.

Under due consideration of these situations, in order to execute the image data processing efficiently, it is possible to define a predetermined area of the RAM as a fixed area and not to transfer the image data of the camera to this fixed area.

FIG. 14 shows this method. For instance, fixed data are stored in an area of serial rows including the row 4, and data are transferred from the SAM to the area other than the fixed area. In this method, however, when the fixed data structure must be changed at the positions determined by A and B on the display shown in FIG. 13 or when this window area must be moved freely to another position on the display, a complicated data processing is required.

This will be explained in further detail with reference to FIGS. 15 to 18. In these drawings, although only the RAM is shown, in the same way as with the cases shown in FIGS. 11, 12 and 14, the assumption is made that each of the SAMs is split into the upper (U) portion and the lower (L) portion, and further the upper and lower portions of the RAM correspond one-to-one to the upper and lower portions of the SAMs. Further, since the split transfer method is adopted, in the SAMs, it is possible to set the head position of the serial access and the final position of-the serial access at which the split upper and lower portions of the SAM are switched. First, in FIG. 15, as shown by arrows, data are accessed in series via the SAM to the column address (a) in the row 1 to obtain the background data. During this serial access, data are transferred from the row 4 of the fixed data area of the RAM to the U portion of the SAM for instance and further these transferred data are accessed in series. By doing this, it is possible to display an inserted picture composed of fixed data. In this method, however, although data must be next accessed beginning from the address (b) in the row 1 of the RAM, since data in this area can be transferred to only the U portion of the SAM, there exists such a problem in that it is impossible to connect data of the background to data of an inserted picture being accessed in series at the U portion. This problem can be solved by arranging fixed data appropriately so as to correspond to the addresses (a) and (b), as shown in FIG. 16. In FIG. 16, fixed data are so arranged that when the data are being serial accessed from the address (a) to the address (b), the serial access is shifted from the U portion to the L portion and further that when the serial access begins from the address (a) and reaches the upper end, the serial access is changed beginning from the address (0) to the address (b). By arranging the fixed data as described above, it is possible to shift the serial access to the background data beginning from the address (b), so that the problem as explained with reference to FIG. 15 can be solved.

Here, under the conditions that the data are arranged as described above, when the position of the inserted picture is moved on the display, a problem arises. This will be explained with reference to FIG. 17.

FIG. 17 shows the case where the area of the inserted picture data area is perfectly included in the data area of the L portion. In this case, when the fixed data arrangement the same as with the case shown in FIG. 16 is adopted, at the address (b) at which the inserted picture display is switched to the background display, there arises a problem in that data must be transferred from the RAM to the SAM on the side where the serial access is being made. To overcome this problem, as shown in FIG. 18, it is necessary to rearrange the fixed data so that the data transfer is not required from the RAM to the SAM on the side where the serial access is being made. In addition, in spite of the fact that it is ideal that both the inserted picture data and the background data can be arranged at predetermined positions irrespective of the inserted picture position on the display, this ideal arrangement cannot be attained in the prior art video memory system.

As described above, in the prior art video memory systems, the data arrangement of inserted picture must be finely corrected according to the position and the size of the inserted picture relative to the background, with the result that there exists a problem in that a high data processing efficiency cannot be attained, in spite of the fact that the data area of inserted picture and the data area of the background picture are arranged separately from each other in the RAM.

SUMMARY OF THE INVENTION

Accordingly, it is an object of the present invention to provide a video memory system which can arrange image data at a predetermined area of the memory, irrespective of the display position of an inserted picture, when image data of different types are displayed at the same time, as when an inserted picture is displayed in a background picture on a display.

According to the present invention, there is provided a video memory system, comprising:

a RAM for storing fixed image data at partial portions;

two SAMs each split into at least first and second portions each for transferring a series of data simultaneously to and from said RAM, without synchronism with each other;

transferring means for transferring data from/to the second portion of said SAM to/from said RAM, when the first portion of said SAM is being accessed in series; and address designating means for determining a head address for serial access in the first portion of said SAM and a final address at which the serial access in the first portion is shifted to serial access in the second portion of said SAM.

The video memory system according to the present invention is particularly effective when any one of background picture and inserted picture is motion (moving) picture and the other of them is motionless (still) picture.

In the video memory system according to the present invention, in the triple-port video RAM having two serial ports of split register type for each single RAM port, whenever the split registers are switched in the SAM port, the head address of the serial access and the final address at which the serial access is switched can be both determined freely. In addition, when the RAM port is split into two column areas, data can be transferred from either of the split columns of the RAM to one of the split SAMs. Therefore, as when fixed data other than the background data are stored at the fixed area, it is possible to transfer data from the SAM port, without any problems in series data transfer.

BRIEF DESCRIPTION OF THE DRAWINGS

In the attached drawings.

DETAILED DESCRIPTION OF THE EMBODIMENTS

The embodiments of the present invention will be described hereinbelow with reference to the attached drawings.

Figure 1:
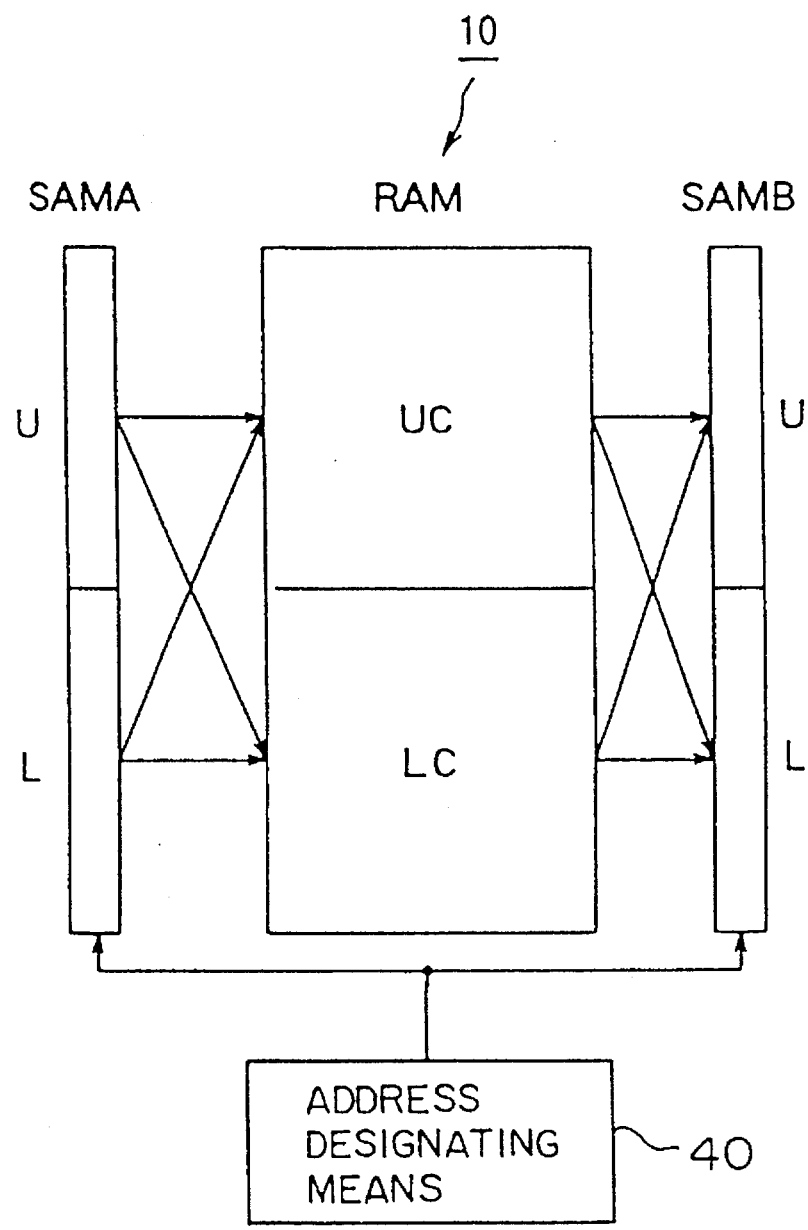
FIG. 1 is an illustration for assistance in explaining a schematic construction of a first embodiment of the video memory system according to the present invention, in which data transfer is shown between a RAM having two column portions and two SAMs each having two registers in one-to-one correspondence between the columns and the registers.

FIG. 1 is an illustration showing a first embodiment of the video memory system according to the present invention. The video memory system shown in FIG. 1 is of triple-port VRAM 10, which has one RAM input/output port and two SAM input/output ports. In correspondence to each of these ports, one RAM and two SAMs can be operative independently from each other without synchronism with each other perfectly. In addition, registers of the SAMs shown in FIG. 1 are of split transfer type, so that data can be transferred in split mode from the SAMs, respectively. Further, with the use of address designating means 40, an address at which the split register is switched in serial access and a head address of the serial access of the switched split register can be freely set.

Further, during the split data transfer between the RAM and the SAM, data can be transferred from the split portion of the SAM to any split portions of the RAM. In more detail, data transfer can be made from the U portion of the SAMA to not only the UC portion of the RAM but also to the LC portion of the RAM. The same can be applied to the other SAM portion.

Figure 2:
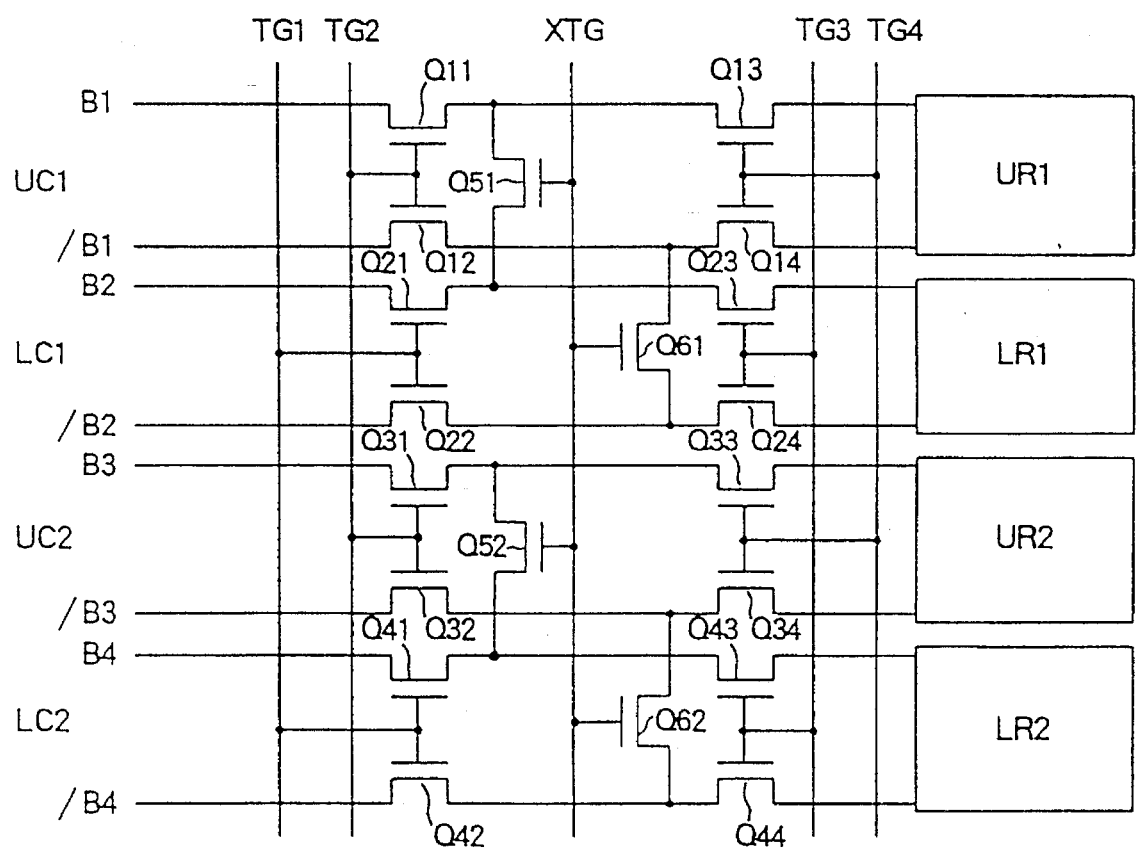
FIG. 2 is a circuit diagram showing the connection between the columns and the registers to realize the data transfer between the RAM and the SAM shown in FIG. 1.

FIG. 2 is a circuit diagram showing the connections between the RAM and the SAM, which can realize the above-mentioned data transfer. The circuit construction shown in FIG. 2 is the same as that already proposed as the cross-transfer system, in which 4 registers UR1, LR1, UR2 and LR2 of the SAM are provided in correspondence to 4 partial columns UC1, LC1, UC2 and LC2, respectively. That is, the partial column UC1 is connected to the register UR1 through two bit lines B1 and /B1; the partial column LC1 is connected to the register LR1 through two bit lines B2 and /B2; the partial column UC2 is connected to the register UR2 through two bit lines B3 and /B3; and the partial column LC2 is connected to the register LR2 through two bit lines B4 and /B4, respectively.

Two transistors Q11 and Q13 are connected to the bit line B1 in series; two transistors Q12 and Q14 are connected to the bit line /B1 in series; two transistors Q21 and Q23 are connected to the bit line B2 in series; two transistors Q22 and Q24 are connected to the bit line /B2 in series; two transistors Q31 and Q33 are connected to the bit line B3 in series; two transistors Q32 and Q34 are connected to the bit line /B3 in series; two transistors Q41 and Q43 are connected to the bit line B4 in series; and two transistors Q42 and Q44 are connected to the bit line /B4 in series, respectively.

The gates of the two transistors Q11 and Q12 are connected an common and controlled by a transfer signal TG2; the gates of the two transistors Q13 and Q14 are connected an common and controlled by a transfer signal TG4; the gates of the two transistors Q21 and Q22 are connected an common and controlled by a transfer signal TG1; the gates of the two transistors Q23 and Q24 are connected an common and controlled by a transfer signal TG3; the gates of the two transistors Q31 and Q32 are connected an common and controlled by the transfer signal TG2; the gates of the two transistors Q33 and Q34 are connected in common and controlled by the transfer signal TG4; the gates of the two transistors Q41 and Q42 are connected in common and controlled by the transfer signal TG1; and the gates of the two transistors Q43 and Q44 are connected in common and controlled by the transfer signal TG3, respectively.

A transistor Q51 to the gate of which a control signal XTG is inputted is connected in series between the output sides of the transistors Q11 and Q21; a transistor Q52 to the gate of which the control signal XTG is inputted is connected in series between the output sides of the transistors Q31 and Q41; a transistor Q61 to the gate of which the control signal XTG is inputted is connected in series between the output sides of the transistors Q12 and Q22; and a transistor Q62 to the gate of which the control signal XTG is inputted is connected in series between the output sides of the transistors Q32 and Q42, respectively.

The operation of the transfer gate as described above will be described hereinbelow.

The bit lines B1 and /B1 of the partial column UC1 can transfer data to both of the registers LR1 and UR1. To transfer data between the L portion of the RAM and the L portion of the SAM and between the U portion of the RAM and the U portion of the SAM, that is, between the column of the RAM and the register of the SAM, the control signal XTG is set to a low level, and the transfer signals TG1 and TG3 or TG2 and TG4 are set to a high level, in the same way as with the prior art data transfer.

In contrast with this, to transfer data from the L portion to the U portion or from the U portion to the L portion (referred to as cross-transfer), the control signal XTG is set to the high level and the transfer signals TG1 and TG4 or TG2 and TG3 are set also to the high level.

By the way, when the memory capacity increases and the integration rate increases, the pattern pitch of the column decreases, so that there exists the case where it is impossible to arrange the register of the SAM for each column even in accordance with the microminiaturization processing technique. In this case, it is preferable to adopt such a construction that one register is arranged for each two columns.

Figure 3:
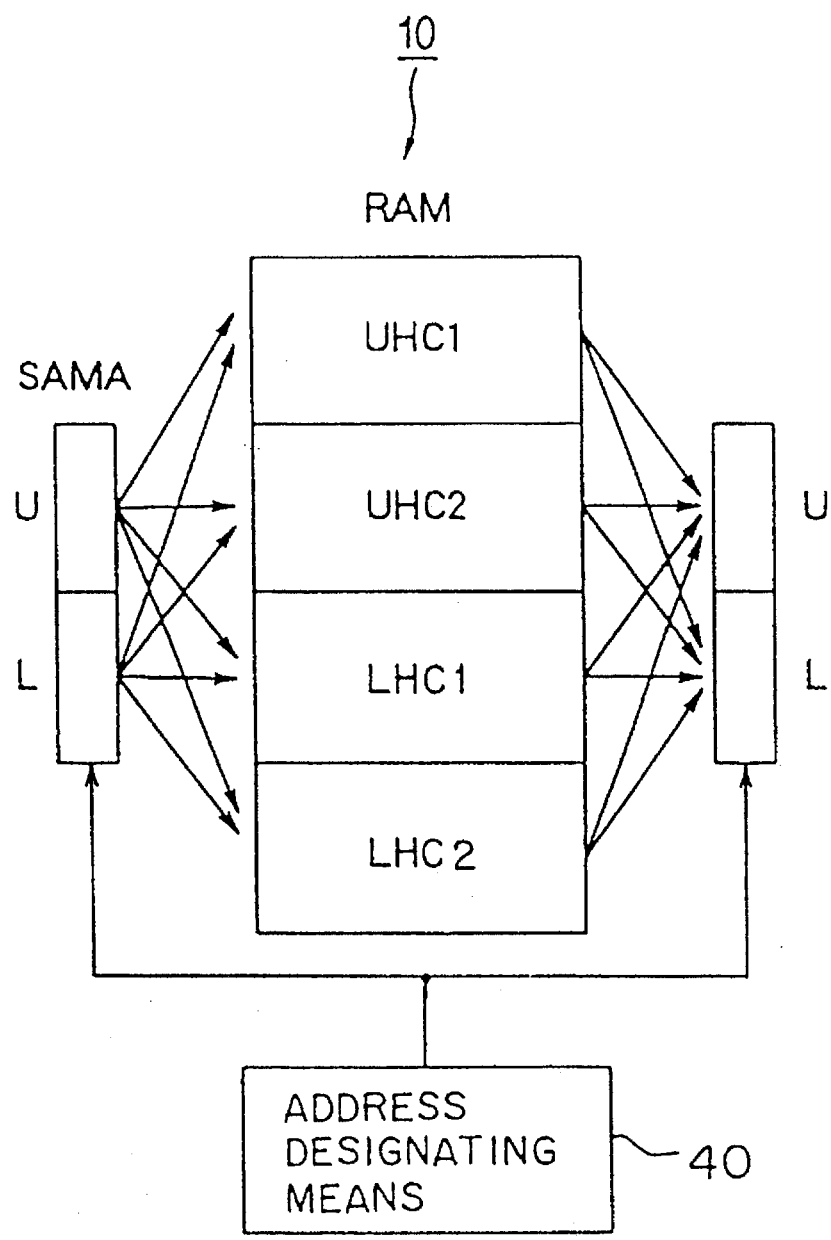
FIG. 3 is an illustration for assistance in explaining a schematic construction of a second embodiment of the video memory system according to the present invention, in which data transfer is shown between a RAM having four column portions and two SAMs each having two registers in two-to-one correspondence between the columns and registers.

FIG. 3 shows a video memory construction suitable to the data transfer construction as described above. In FIG. 3, the columns of the RAM are split into two in correspondence to the L portion and the U portion of the SAM in the same way as in FIG. 1. However, the split column is further split into column groups connected to the registers. In more detail, the L portion of the RAM is split into LHC1 and LHC2, and the U portion of the RAM is split into UHC1 and UHC2, that is, into 4 groups as the whole. These split columns can transfer data to any of the L or U portion of the SAM.

Figure 4:
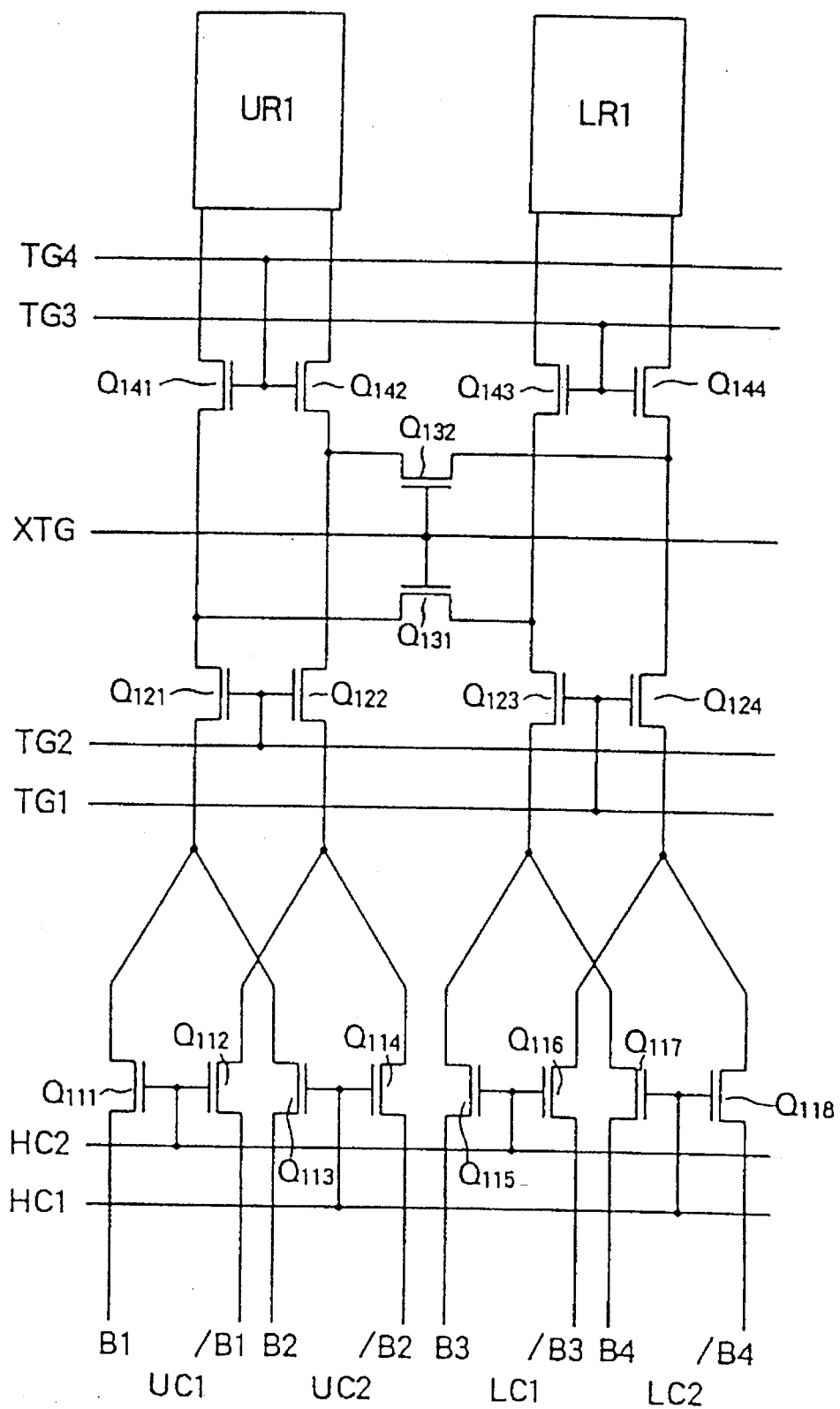
FIG. 4 is a circuit diagram showing the connection between the columns and the registers to realize the data transfer between the RAM and the SAM in FIG. 3.

FIG. 4 is a more detailed circuit showing the connection of the registers for realizing the above-mentioned data transfer.

In corresponding to 4 partial columns UC1, LC1, UC2 and LC2, two registers UR1 and LR1 are provided. The bit line B1 of the partial column UC1 and the bit line B2 of the partial column UC2 are connected in common to the register UR1. A transistor Q111 is connected in series to the bit line B1, and a transistor Q113 is connected in series to the bit line B2. Further, between the common junction point and the register UR1, a transistor Q121 controlled by the transfer signal TG2 and a transistor Q141 controlled by the transfer signal TG4 are connected in series.

Further, the bit line /B1 of the partial column UC1 and the bit line /B2 of the partial column UC2 are connected in common to the register UR1. A transistor Q112 is connected in series to the bit line /B1, and a transistor Q114 is connected in series to the bit line /B2. Further, between the common junction point and the register UR1, a transistor Q122 controlled by the transfer signal TG2 and a transistor Q142 controlled by the transfer signal TG4 are connected in series.

Further, the bit line B3 of the partial column LC1 and the bit line B4 of the partial column LC2 are connected in common to the register LR1. A transistor Q115 is connected in series to the bit line B3, and a transistor Q117 is connected in series to the bit line B4. Further, between the common junction point and the register LR1, a transistor Q123 controlled by the transfer signal TG1 and a transistor Q143 controlled by the transfer signal TG3 are connected in series.

In the same way, the bit line /B3 of the partial column LC1 and the bit line /B4 of the partial column LC2 are connected in common to the register LR1. A transistor Q116 is connected in series to the bit line /B3, and a transistor Q118 is connected in series to the bit line /B4. Further, between the common junction point and the register LR1, a transistor Q124 controlled by the transfer signal TG1 and a transistor Q144 controlled by the transfer signal TG3 are connected in series.

The transistors Q113, Q114, Q117 and Q118 are controlled by an HC1 signal, and the transistors Q111, Q112, Q115 and Q116 are controlled by an HC2 signal, respectively. Further, the output sides of the transistors Q121 and Q123 are connected to each other via a transistor Q131 controlled by the control signal XTG, and in the same way the output sides of the transistors Q122 and Q124 are connected to each other via a transistor Q132 controlled by the control signal XTG, respectively.

In the circuit construction as described above, since the 2 columns are connected as a pair so as to form a column corresponding to the L portion and the U portion of the SAM mutually, when the control signal XTG is set to the high level, it is possible to cross-transfer data from the upper column to the lower register or from the lower column to the upper register, respectively. Further, on the basis of the combinations of the signals HC1, HC2, TG1, TG2, TG3 and TG4, it is possible to transfer data from any column to any register. For instance, in order to connect the UC1 portion to the register UR1 of the U portion of the SAM, under the conditions that the HC1 signal is set to the low level and the HC2 signal is set to the high level, the transfer signal TG2 is set to the high level; the control signal XTG is set to the low level; and the transfer signal TG4 is set to the high level. Further, in order to connect the UC1 portion to the register LR1 of the L portion of the SAM, TG2 is set to H; XTG is set to H; and TG3 is set to H.

Figure 5:
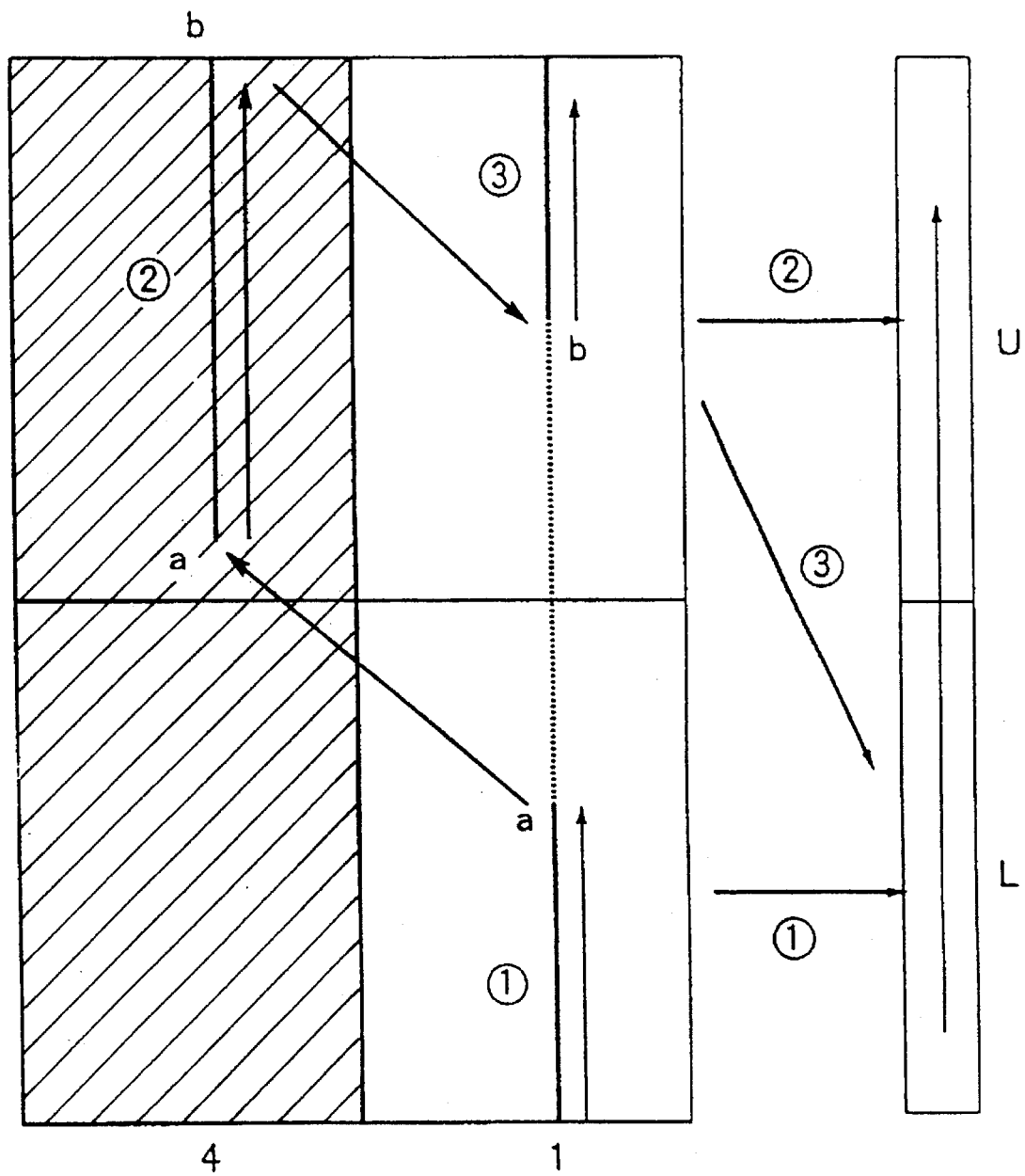
FIG. 5 is an illustration for assistance in explaining the data transfer in the construction shown in FIG. 1.

As described above, when the data cross-transfer is enabled between the RAM and the SAM, it is possible to allocate the image data to the RAM, irrespective of the position of the inserted picture on the display as follows:

First, as shown in FIG. 5, although the inserted picture data can be stored in a data area by collecting some rows of the RAM together, the reason why the data structure is not dependent upon the position of the inserted picture on the display will be first explained.

The assumption is made that background image data are stored in the row 1 and the inserted picture data are stored from the addresses (a) to (b). (1) The background data portion 1 to the address (a) are transferred to the L portion of the SAM and then serial-accessed. (2) After that, the inserted picture data are transferred from the inserted picture area row 4 of the U portion of the RAM to the SAM and then the data portion 2 is serial-accessed in the U portion of the SAM. (3) After having accessed to the address (b) of the data portion 2, although the data access returns to the background data, at this time, when data are cross-transferred from the U portion of the RAM to the L portion of the SAM, it is possible to serial-access the background data 3 in the L-portion of the SAM after the data 2 have been accessed in the U portion of the SAM. In this case, it is apparent that the stored position of the inserted picture data 2 is not dependent upon the position of the inserted picture on the background of the display, because of the data cross-transfer.

Figure 6:
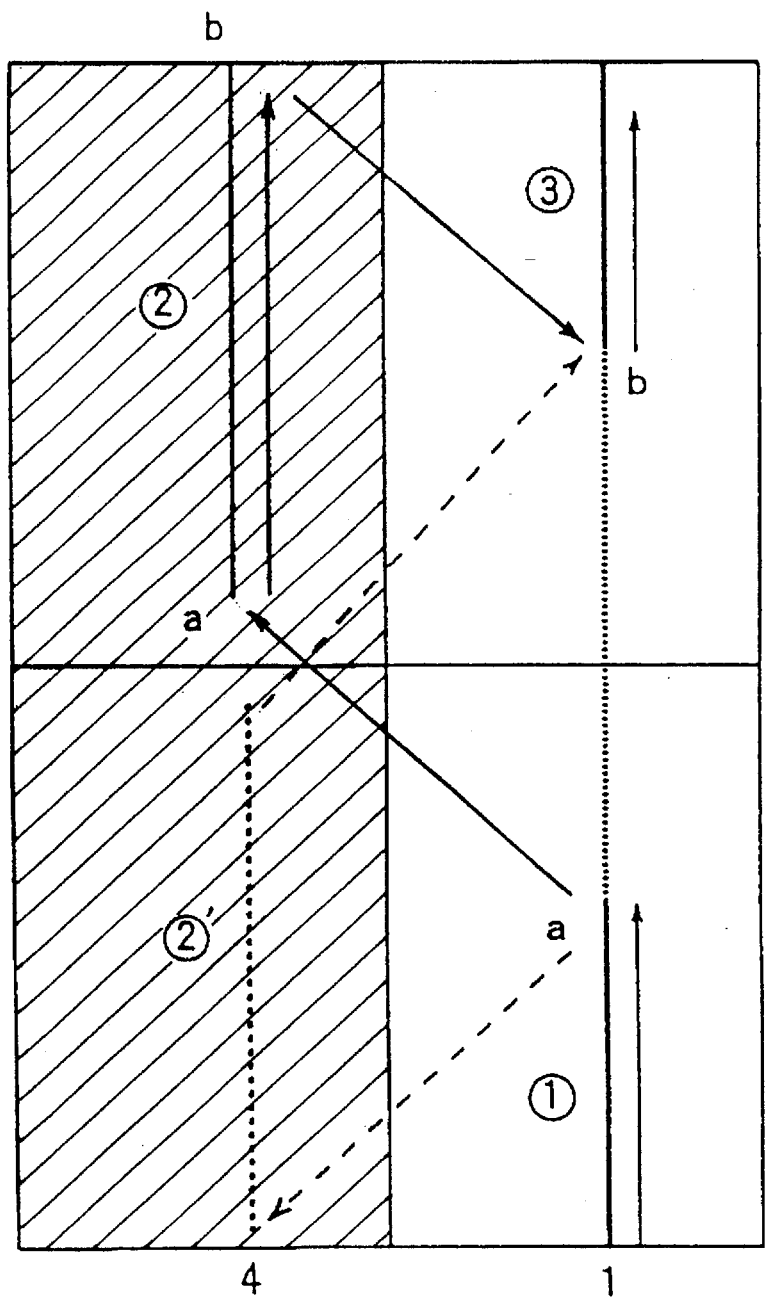
FIG. 6 is an illustration for assistance in explaining the data transfer when a plurality of inserted pictures are stored in the construction shown in FIG. 5.

Further, as shown in FIG. 6, it is possible to facilitate the switching of the inserted picture data by storing some different data at the inserted picture data area.

Figure 7:
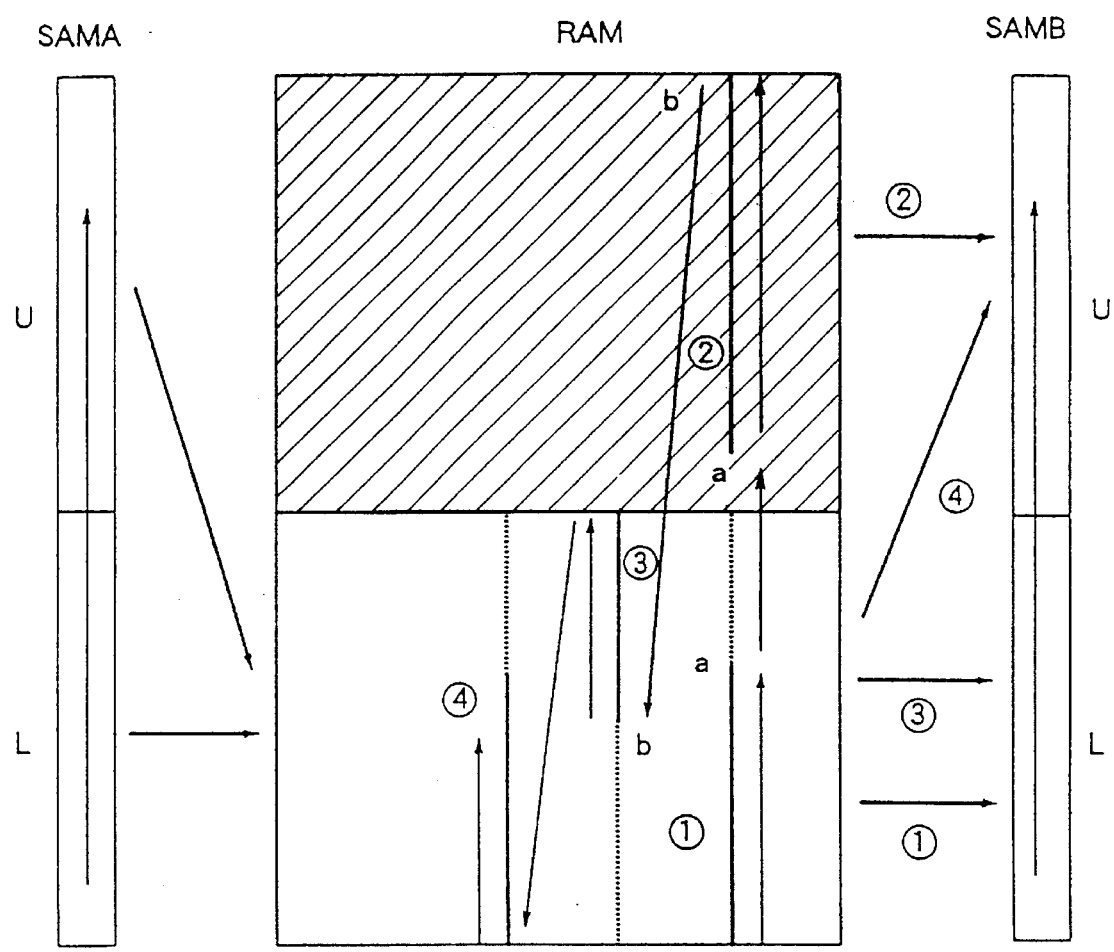
FIG. 7 is an illustration for assistance in explaining the data transfer of the embodiment in which the inserted picture data area is determined at the upper area.

Further, FIG. 7 shows another method of forming the inserted picture data area which is different from that shown in FIG. 5. In more detail, the inserted picture data are allocated to the U portion of the RAM, and the L portion is used also as the background data area. Therefore, the serial data supplied from a camera are cross-transferred appropriately through the SAMA, and then written in the L portion of the RAM. The data are outputted in series to the display by transferring data to the L portion and the U portion of the SAMB in series in the order of the thick arrow numbers from 1 to 4. In the example shown, the cross-transfer is executed at the transfer number 4.

Figure 8:
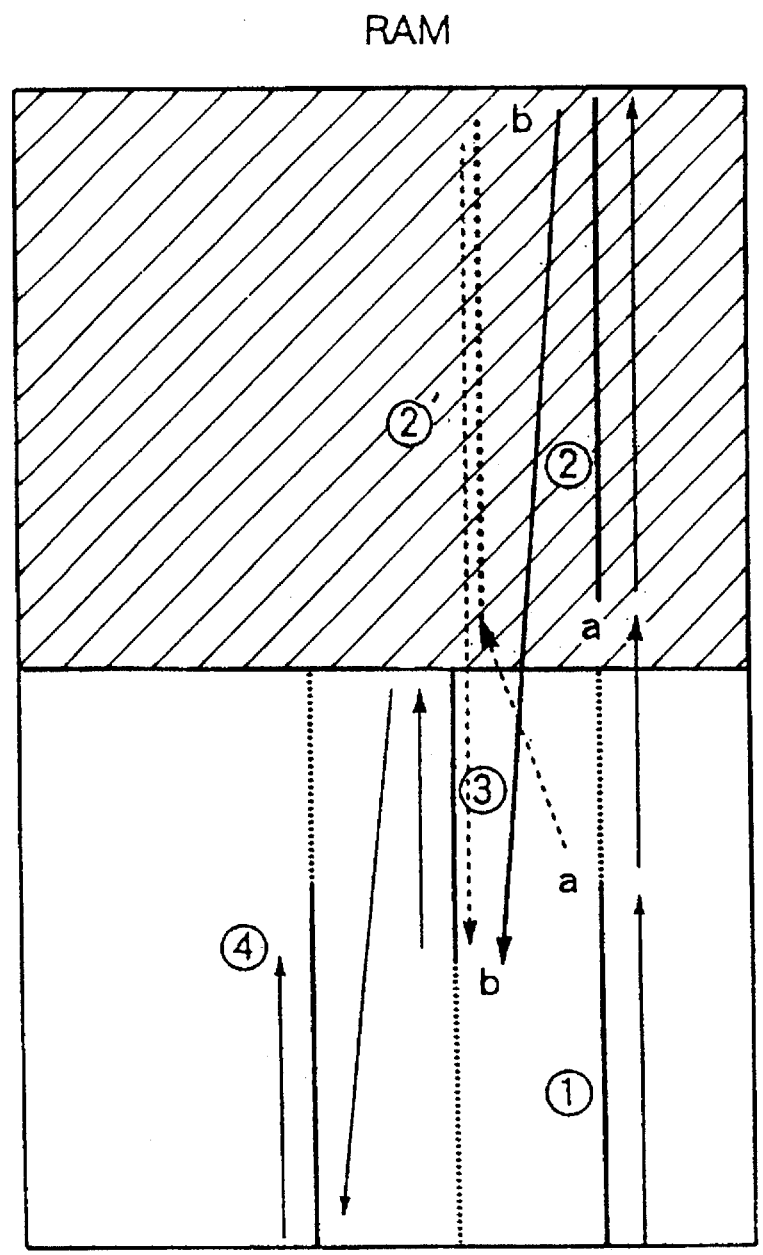
FIG. 8 is an illustration for assistance in explaining the data transfer when a plurality of inserted pictures are stored in the construction shown in FIG. 7.

When data are allocated, it is possible to facilitate the switching of the inserted picture data by storing some inserted picture data in the inserted picture data area, as shown in FIG. 8. In the example shown in FIG. 8, the inserted picture data are divided into 2 and 2', and the data are accessed in such a way that either of the inserted picture data 2 or 2', can be connected to the background data 1.

Figure 9:
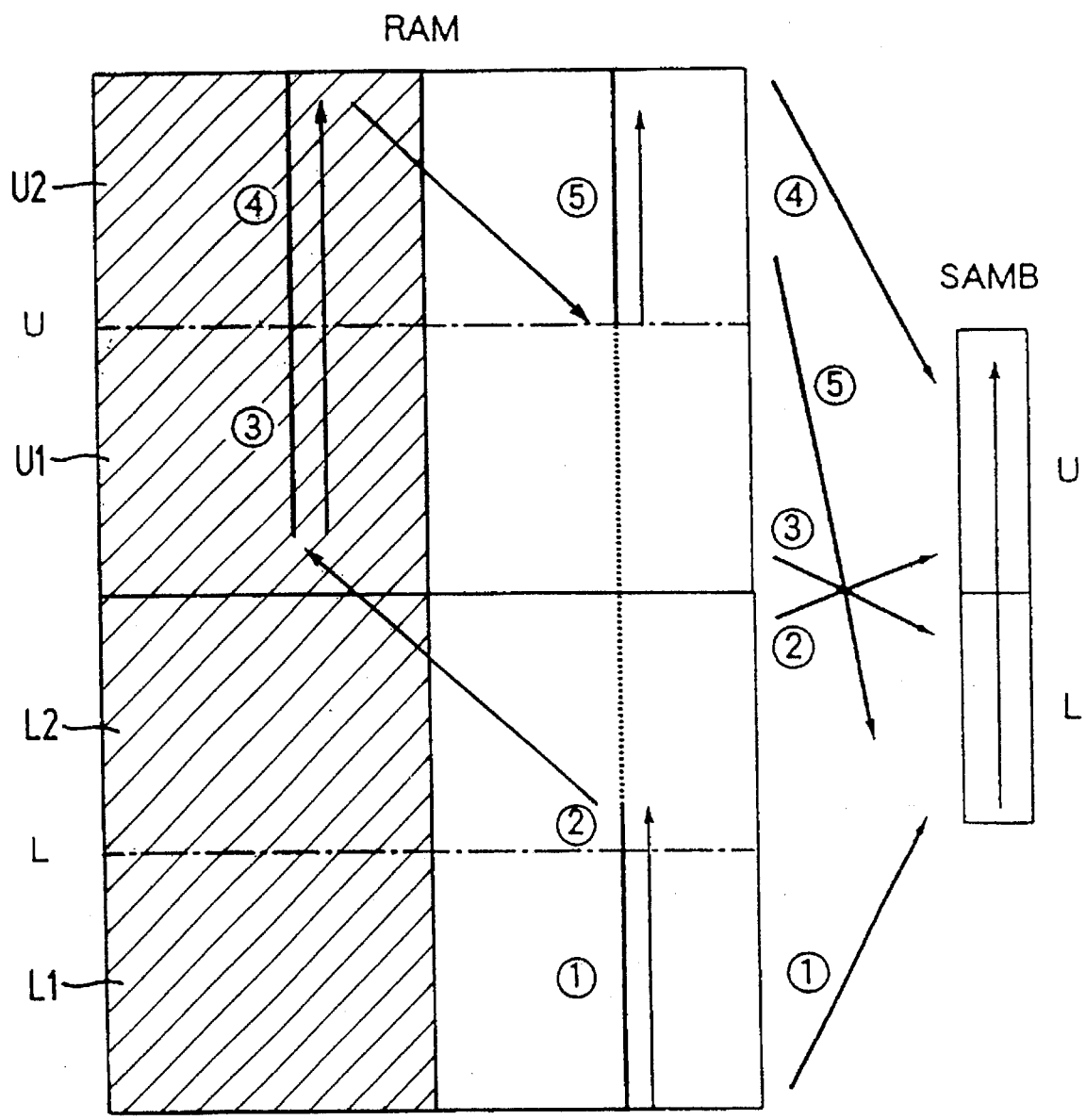
FIG. 9 is an illustration for assistance in explaining the data transfer in the construction shown in FIG. 3.
Figure 10:
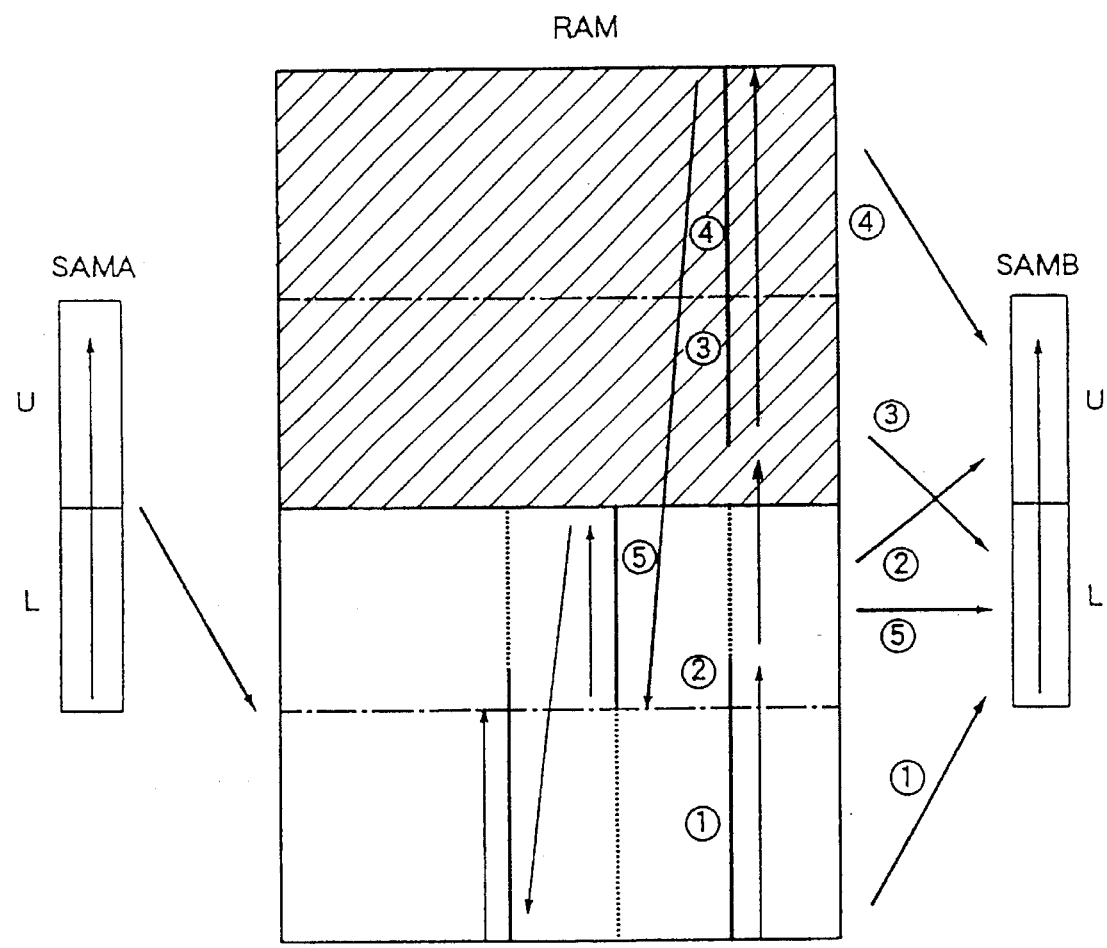
FIG. 10 is an illustration for assistance in explaining the data transfer of the embodiment in which the inserted picture data area is determined at the upper area.
Figure 11:
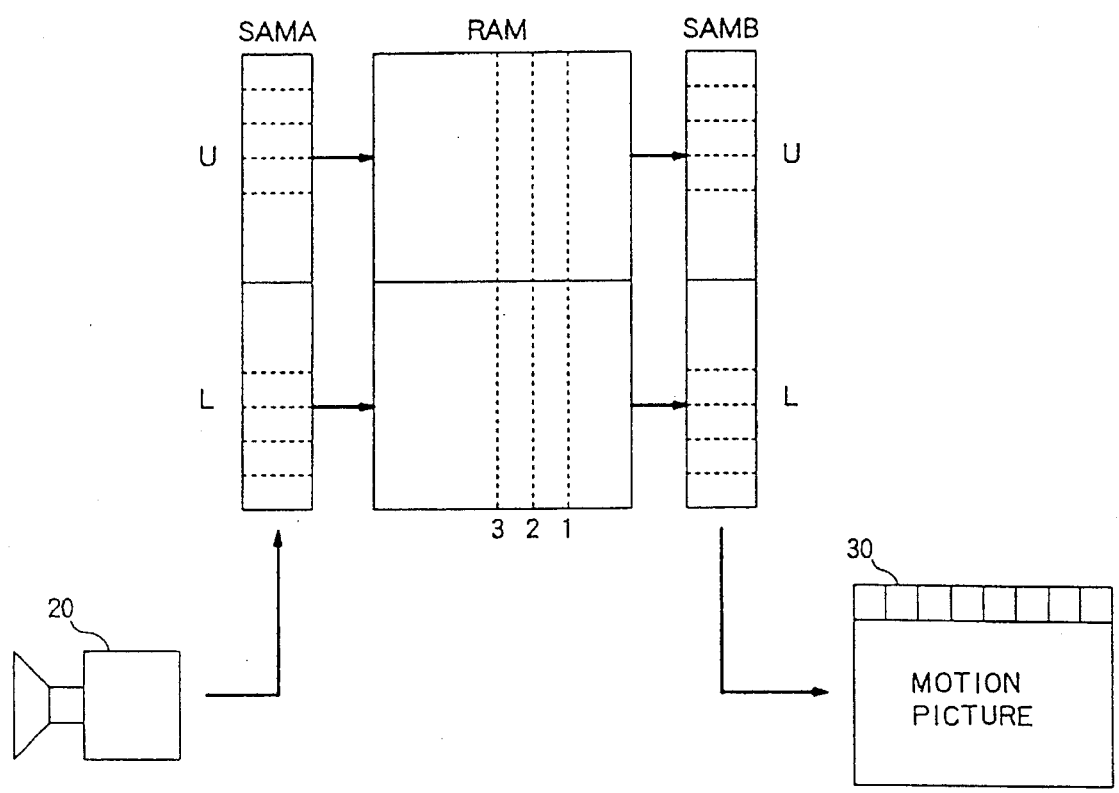
FIG. 11 is an illustration for assistance in explaining the prior art triple port RAM.
Figure 12:
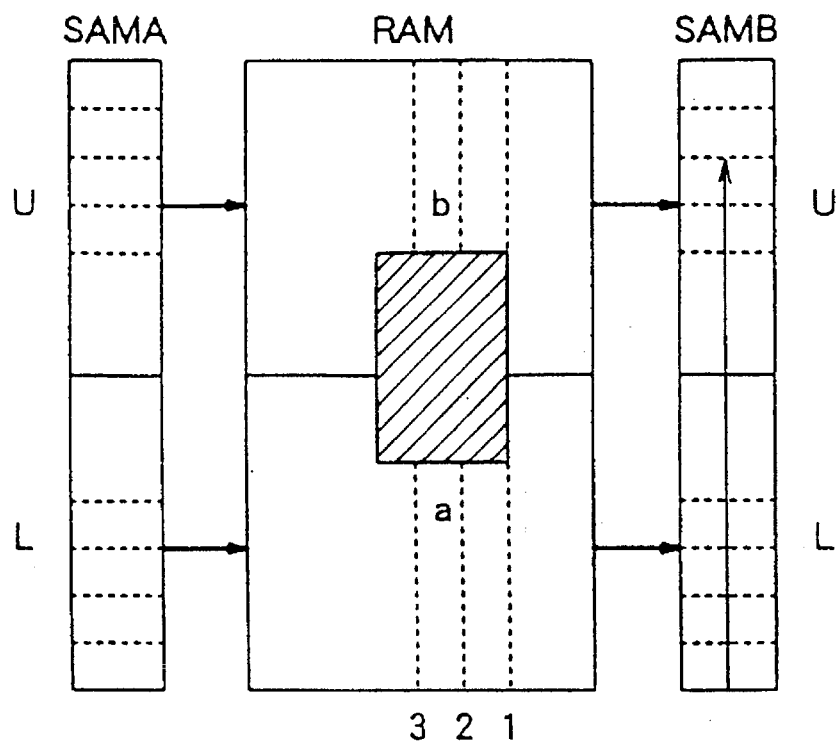
FIG. 12 is an illustration for assistance in explaining the state where an inserted picture data area is determined in the RAM in the triple-port VRAM shown in FIG. 11.
Figure 13:
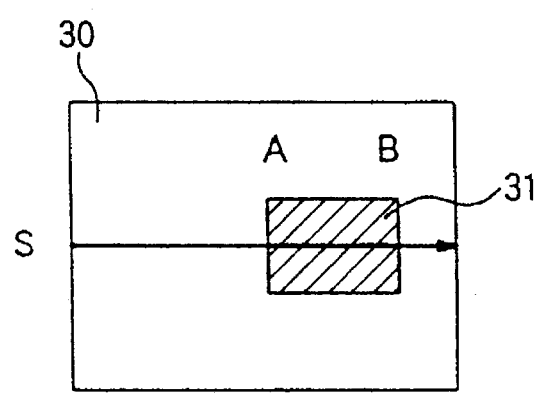
FIG. 13 is an illustration showing an inserted picture on the display.
Figure 14:
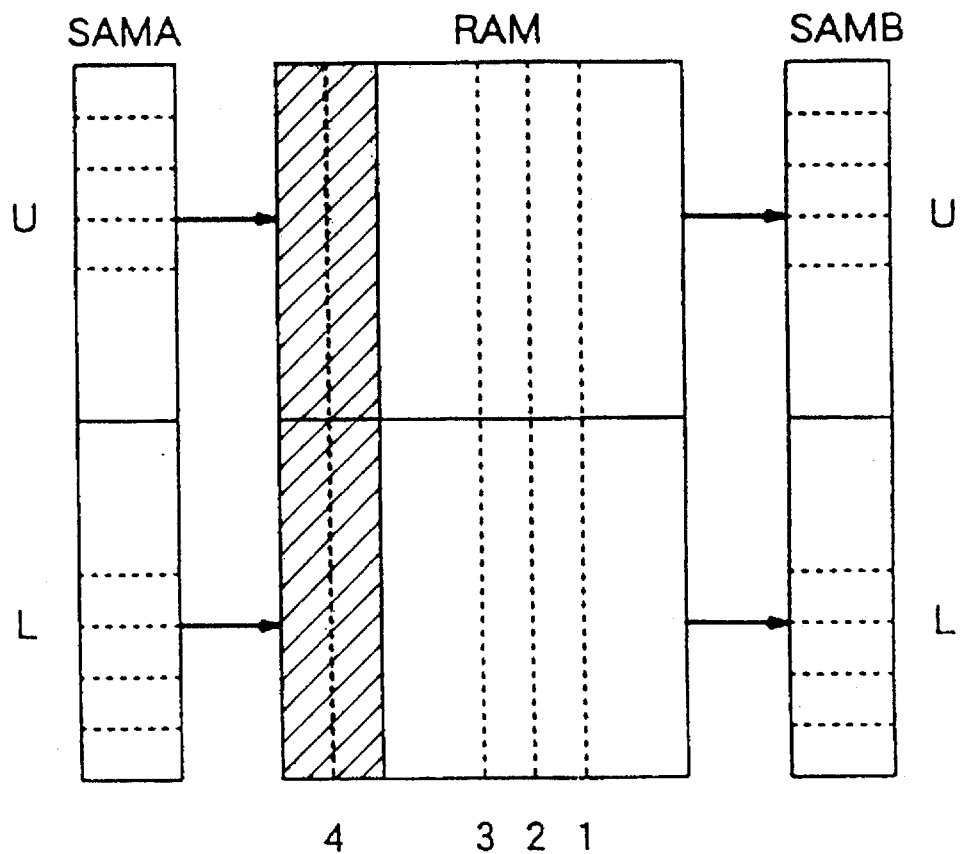
FIG. 14 is an illustration for assistance in explaining the status where inserted picture data are fixed in the RAM.
Figure 15:
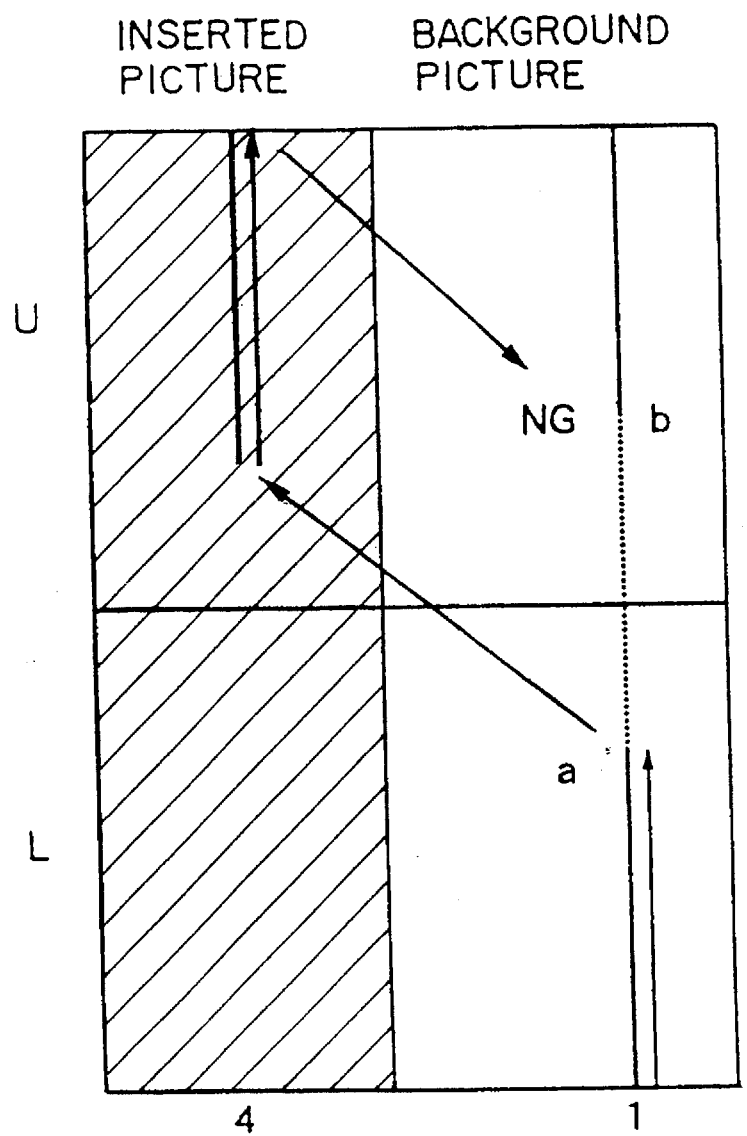
FIG. 15 is an illustration for assistance in explaining a problem involved in the prior art system shown in FIG. 14.
Figure 16:
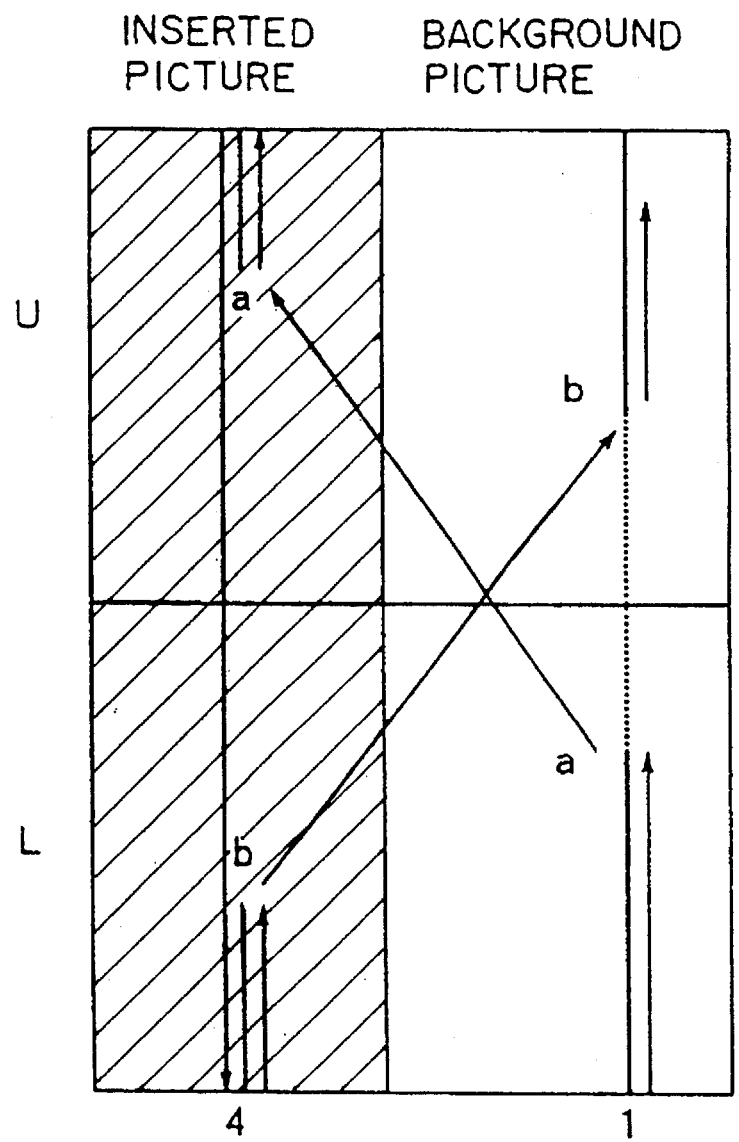
FIG. 16 is an illustration for assistance in explaining that the inserted picture data must be changed to solve the problem shown in FIG. 15.
Figure 17:
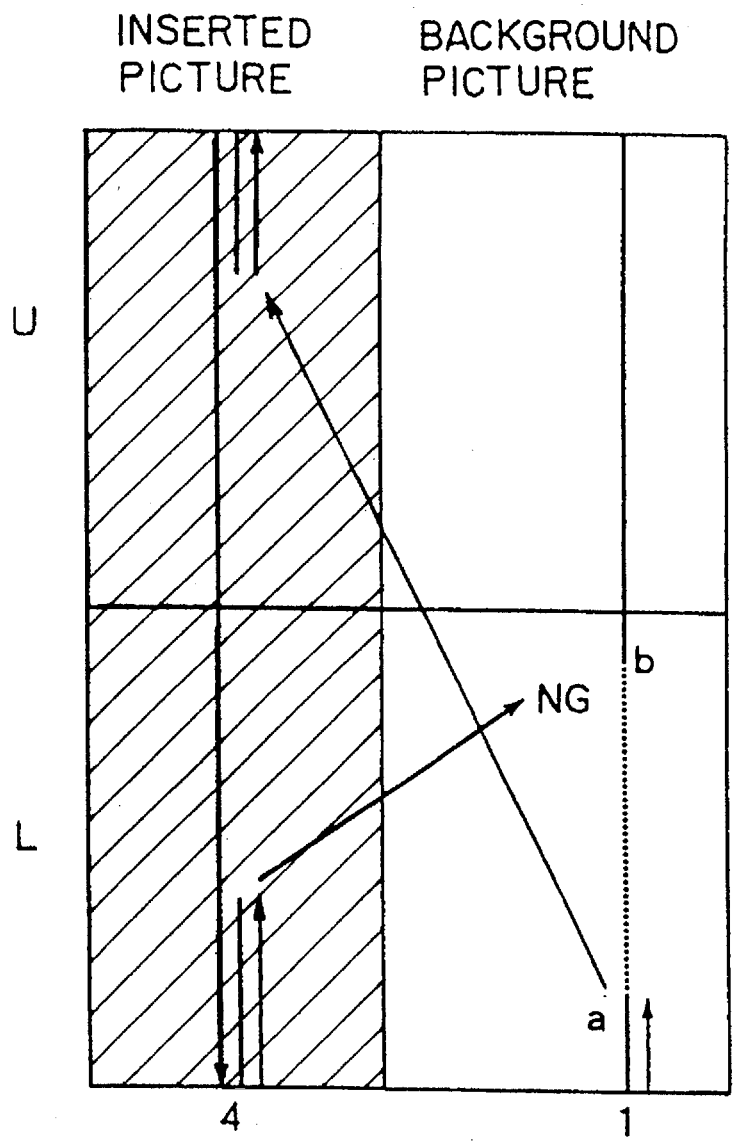
FIG. 17 is an illustration for assistance in explaining a problem involved when an inserted picture area is moved on the display.
Figure 18:
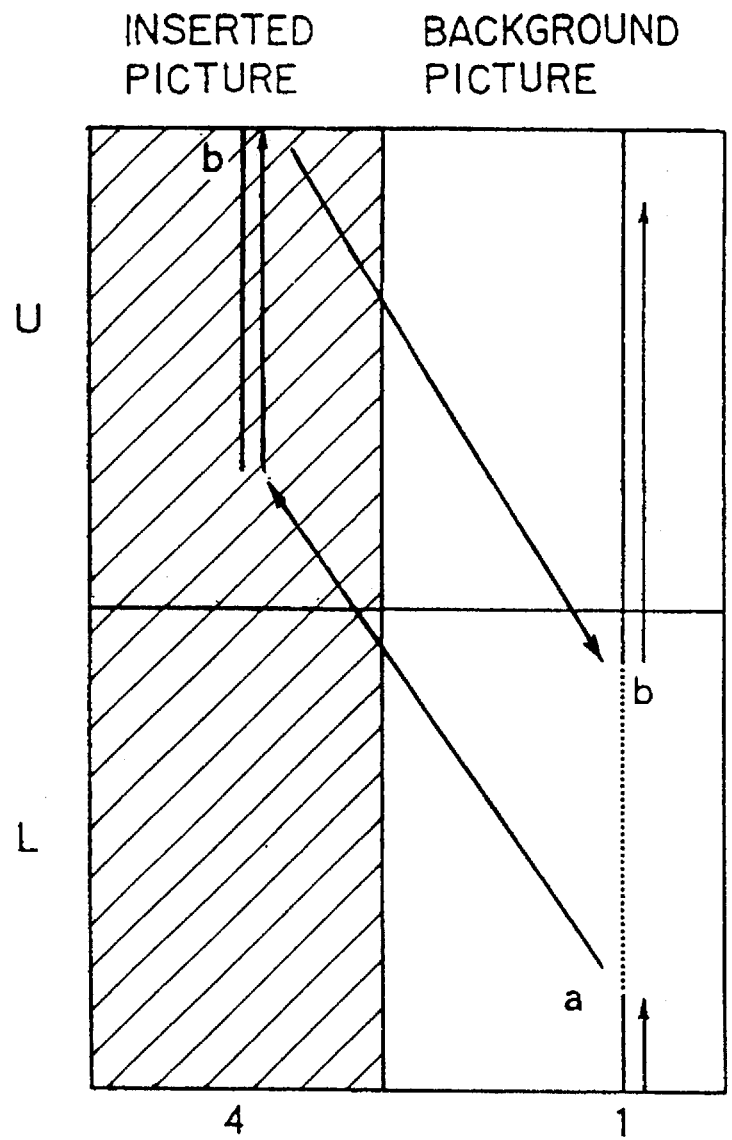
FIG. 18 is an illustration for assistance in explaining that the inserted picture data must be changed to solve the problem shown in FIG. 17.

In FIGS. 9 and 10, one SAM is arranged for two columns for executing the cross-transfer.

In FIG. 9, the background data 1 are stored in the L1 portion of the RAM; the background data 2 are stored in the L2 portion of the RAM; the following inserted picture data 3 are stored in the U1 portion of the RAM; and the inserted picture data 4 are stored in the U2 portion of the RAM. Therefore, it is possible to execute (1) the transfer of the background data 1 to the SAMBL, (2) the cross-transfer of the background data 2 to the SAMBU, (3) the cross-transfer of the inserted picture data 3 to the SAMBL, (4) the transfer of the inserted picture data 4 to the SAMBU, and (5) the cross-transfer the background data 5 to the SAMBL, so that it is possible to connect the background data to the inserted picture data.

FIG. 10 shows an example where the inserted picture data are allocated to the U portion of the RAM, and the background data are stored at the L portion of the RAM. This corresponds to the case where the examples shown in FIG. 8 and 9 are combined with each other, so that it is possible to transfer data in the order as shown by the numbers in FIG. 10.

As described above, in the video memory system according to the present invention, it is possible to arrange the inserted picture data at the areas of the RAM, without mixture with the background data. In this case, all the data stored in the area of the RAM can be transferred to the SAM portion by dividing the data transfer into several times.

In the above description, although the case where the background data are motion picture, the same can be applied to the case where the inserted picture is a motion picture. In this case, the image data of the camera are transferred to the inserted picture data area, so that it is unnecessary to change the data arrangement position on the RAM according to the position of the inserted picture on the display.

As described above, in the video memory system according to the present invention, since the cross-transferable split transfer function is provided for the SAM of the triple-port VRAM and further since the head and final addresses of the serial access of the respective split data can be determined freely, when an inserted picture is displayed on the background picture on a display unit, it is possible to improve the efficiency of the image data processing.

What is claimed is:

1. A video memory system, comprising:
    a RAM having a first RAM section and a second RAM section, each section for storing data;
    a first SAM having a first SAM portion and a second SAM portion, each portion for temporarily storing data corresponding to either of the first or the second RAM sections;
    a second SAM having a third SAM portion and a fourth SAM portion, each portion for temporarily storing data corresponding to either of the first or the second RAM sections;
    transferring means for,
        in a first mode,
            transferring data between the first SAM portion and the first RAM section and
            transferring data between the second SAM portion and the second RAM section, and
        in a second mode,
            transferring data between the first SAM portion and the second RAM section and
            transferring data between the second SAM portion and the first RAM section; and
    address designating means for freely designating a head address at which a serial access of the first SAM starts and a final address at which the serial access of the first SAM ends.

2. The video memory system according to claim 1, wherein said transferring means includes means for,
    in a third mode,
        transferring data between the third SAM portion and the first RAM section and
        transferring data between the fourth SAM portion and the second RAM section, and
    in a fourth mode,
        transferring data between the third SAM portion and the second RAM section and
        transferring data between the fourth SAM portion and the first RAM section, and
    wherein said address designating means freely designates a head address at which a serial access of the second SAM starts and a final address at which the serial access of the second SAM ends.

3. The video memory system according to claim 1, including:
    a first gating means for selectively transferring data between either of said first or second SAM portions and either of said first or second RAM sections, and
    a second gating means for selectively transferring data between either of said first or second RAM sections and either of said third or fourth SAM portions.

4. The video memory system according to claim 3, wherein said first and second RAM sections each include neighboring columns, and wherein either of said first or second gating means includes a gate which connects bit lines of neighboring columns of either of said first or second RAM sections in response to a cross-transfer signal.

5. The video memory system according to claim 4, wherein said first and second SAMs each include a number of registers, and wherein a number of columns of either of said first or second RAM sections is the same as the number of registers of said first and second SAMs.

6. The video memory system according to claim 4, wherein said first and second SAMs each include a number of registers, and wherein a number of columns of either of said first or second RAM sections is an integer times the number of registers of said first and second SAMs.

7. The video memory system according to claim 6, wherein the integer is two.

8. The video memory system according to claim 4, wherein said bit lines of the neighboring columns are commonly connected to a line of a register of either of said first or second SAMs.

9. The video memory system according to claim 1, wherein said RAM stores data different from those continuously input from either of said first or second SAMs in a predetermined area.

10. The video memory system according to claim 9, wherein the predetermined area is a specific area where serial data transfer from either of said first or second SAMs to said RAM is inhibited.

11. A video memory system, comprising:
    a RAM having a first RAM section, a second RAM section, a third RAM section and a fourth RAM section, each section for storing data;
    a first SAM having a first SAM portion and a second SAM portion, each portion for temporarily storing data corresponding to any one of said first to fourth RAM sections;
    a second SAM having a third SAM portion and a fourth SAM portion, each portion for temporarily storing data corresponding to any one of said first to fourth RAM sections;
    transferring means for,
        in a first mode,
            transferring data between the first SAM portion and the first RAM section and
            transferring data between the second SAM portion and any one of the second to fourth RAM sections,
        in a second mode,
            transferring data between the first SAM portion and the second RAM section and
            transferring data between the second SAM portion and any one of the first, third or fourth RAM sections, and in a third mode,
  transferring data between the first SAM portion and the third RAM section and
  transferring data between the second SAM portion and any one of the first, second or fourth RAM sections, and
in a fourth mode,
  transferring data between the first SAM portion and the fourth RAM section and
  transferring data between the second SAM portion and any one of the first to third RAM sections; and
address designating means for freely designating a head address at which a serial access of the first SAM starts and a final address at which the serial access of the first SAM ends.

12. The video memory system according to claim 11, wherein said transferring means includes means for,
in a fifth mode,
  transferring data between the third SAM portion and the first RAM section and
  transferring data between the fourth SAM portion and any one of the second to fourth RAM sections,
in a sixth mode,
  transferring data between the third SAM portion and the second RAM section and
  transferring data between the fourth SAM portion and any one of the first, third or fourth RAM sections, and
in a seventh mode,
  transferring data between the third SAM portion and the third RAM section and
  transferring data between the fourth SAM portion and any one of the first, second or fourth RAM sections, and
in an eighth mode,
  transferring data between the third SAM portion and the fourth RAM section and
  transferring data between the fourth SAM portion and any one of the first to third RAM sections, and
wherein said address designating means freely designates a head address at which a serial access of the second SAM starts and a final address at which the serial access of the second SAM ends.

13. The video memory system according to claim 11, wherein a serial access which ends at a final address in the first SAM portion switches to a next head address in the second SAM portion, and a serial access which ends at a final address in the second SAM portion switches to a next head address in the first SAM portion.

14. The video memory system according to claim 12, wherein a serial access which ends at a final address in the third SAM portion switches to a next head address in the fourth SAM portion, and a serial access which ends at a final address in the fourth SAM portion switches to a next head address in the third SAM portion.

15. The video memory system according to claim 11, including:
a first gating means for selectively transferring data between either of said first or second SAM portions and any of said first to fourth RAM sections, and
a second gating means for selectively transferring data between any of said first to fourth RAM sections and either of said third or fourth SAM portions.

16. The video memory system according to claim 15, wherein said first to fourth RAM sections each include neighboring columns, and wherein either of said first or second gating means includes a gate which connects bit lines of neighboring columns of any of said first to fourth RAM sections in response to a cross-transfer signal.

17. The video memory system according to claim 16, wherein said first and second SAMs each include a number of registers, and wherein a number of columns of any of said first to fourth RAM sections is the same as the number of registers of said first and second SAMs.

18. The video memory system according to claim 16, wherein said first and second SAMs each include a number of registers, and wherein a number of columns of any of said first to fourth RAM sections is an integer times the number of registers of said first and second SAMs.

19. The video memory system according to claim 18, wherein the integer is two.

20. The video memory system according to claim 16, wherein said bit lines of the neighboring columns are commonly connected to a line of a register of either of said first or second SAMs.

21. The video memory system according to claim 11, wherein said RAM stores data different from those continuously input from either of said first or second SAMs in a predetermined area.

22. The video memory system according to claim 21, wherein the predetermined area is a specific area where serial data transfer from either of said first or second SAMs to said RAM is inhibited.

23. A video memory system, comprising:
a RAM having a first RAM section and a second RAM section, each section for storing data;
a first SAM having a first SAM portion and a second SAM portion, each portion for temporarily storing data corresponding to either of the first or the second RAM sections;
a second SAM having a third SAM portion and a fourth SAM portion, each portion for temporarily storing data corresponding to either of the first or the second RAM sections;
transferring means for,
  in a first mode,
    transferring data between the first SAM portion and the first RAM section and
    transferring data between the second SAM portion and the second RAM section, and
  in a second mode,
    transferring data between the first SAM portion and the second RAM section and
    transferring data between the second SAM portion and the first RAM section; and
address designating means for freely designating a head address at which a serial access of the first SAM starts and a final address at which the serial access of the first SAM ends, wherein a serial access which ends at a final address in the first SAM portion switches to a next head address in the second SAM portion, and a serial access which ends at a final address in the second SAM portion switches to a next head address in the first SAM portion.

24. The video memory system according to claim 23, wherein said transferring means includes means for,
in a third mode,
  transferring data between the third SAM portion and the first RAM section and
  transferring data between the fourth SAM portion and the second RAM section, and
in a fourth mode, transferring data between the third SAM portion and the second RAM section and transferring data between the fourth SAM portion and the first RAM section, and wherein said address designating means freely designates a head address at which a serial access of the second SAM starts and a final address at which the serial access of the second SAM ends, and wherein a serial access which ends at a final address in the third SAM portion switches to a next head address in the fourth SAM portion, and a serial access which ends at a final address in the fourth SAM portion switches to a next head address in the third SAM portion.

25. The video memory system according to claim 23, including:

a first gating means for selectively transferring data between either of said first or second SAM portions and either of said first or second RAM sections, and a second gating means for selectively transferring data between either of said first or second RAM sections and either of said third or fourth SAM portions.

26. The video memory system according to claim 25, wherein said first and second RAM sections each include neighboring columns, and wherein either of said first or second gating means includes a gate which connects bit lines of neighboring columns of either of said first or second RAM sections in response to a cross-transfer signal.

27. The video memory system according to claim 26, wherein said first and second SAMs each include a number of registers, and wherein a number of columns of either of said first or second RAM sections is the same as the number of registers of said first and second SAMs.

28. The video memory system according to claim 26, wherein said first and second SAMs each include a number of registers, and wherein a number of columns of either of said first or second RAM sections is an integer times the number of registers of said first and second SAMs.

29. The video memory system according to claim 28, wherein the integer is two.

30. The video memory system according to claim 26, wherein said bit lines of the neighboring columns are commonly connected to a line of a register of either of said first or second SAMs.

31. The video memory system according to claim 23, wherein said RAM stores data different from those continuously input from either of said first or second SAMs in a predetermined area.

32. The video memory system according to claim 31, wherein the predetermined area is a specific area where serial data transfer from either of said first or second SAMs to said RAM is inhibited.

* * * * *